United States Patent
Fukuda

(10) Patent No.: US 6,660,462 B1
(45) Date of Patent: Dec. 9, 2003

(54) SEMICONDUCTOR DEVICE AND METHOD OF PRODUCING THE SAME

(75) Inventor: Hiroshi Fukuda, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/543,560

(22) Filed: Apr. 5, 2000

(51) Int. Cl.$^7$ ............................................... G03C 5/00
(52) U.S. Cl. ........................ 430/394; 430/5; 430/313; 430/330; 430/396
(58) Field of Search ..................... 430/5, 313, 330, 430/394, 396

(56) References Cited

U.S. PATENT DOCUMENTS 5,946,563 A * 8/1999 Uchara et al. ............... 438/183
5,994,002 A * 11/1999 Matsuoka ....................... 430/5

FOREIGN PATENT DOCUMENTS

| JP | 2638561 | 4/1997 |
| JP | 2650962 | 5/1997 |
| JP | 09-311432 | 12/1997 |

OTHER PUBLICATIONS

ULSI Litography Technical Renovation, Science Forum Tokyo, 1994, pp. 34–40.
A. Jungmann et al, "Benchmarking of Software Tools for Optical Proximit Correction", Proceedings of the SPIE, 1998, vol. 3334, pp. 921–931.

* cited by examiner

Primary Examiner—Mark F. Huff
Assistant Examiner—Daborah Chacko-Davis
(74) Attorney, Agent, or Firm—Mattingly, Stanger & Malur, P.C.

(57) ABSTRACT

Exposure is performed by using a phase shifting mask having a constant shifter line width L in the direction of transistor gate length Lg, thereby forming a designed transistor gate pattern in a part of a shifter edge of the phase shifting mask and forming a dummy gate pattern which has the same device structure as that of the transistor gate but does not have a circuit function in the rest of the shifter edge so as to be isolated from the transistor gate pattern. By the operation, the minimum distance between each of all of the transistor gate patterns in an active region and each of the dummy gate patters is set to be substantially constant.

9 Claims, 10 Drawing Sheets

18 : DESIGNED TRANSISTOR GATE PATTERNS
19 : DUMMY GATE PATTERNS
2 : PHASE-SHIFTED REGION

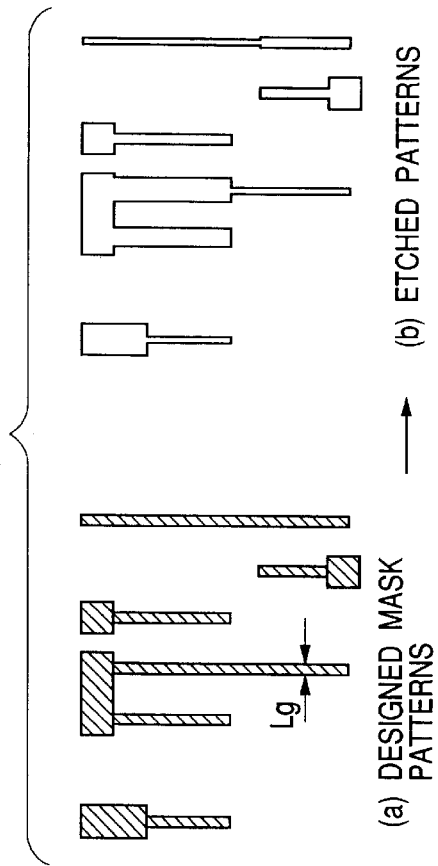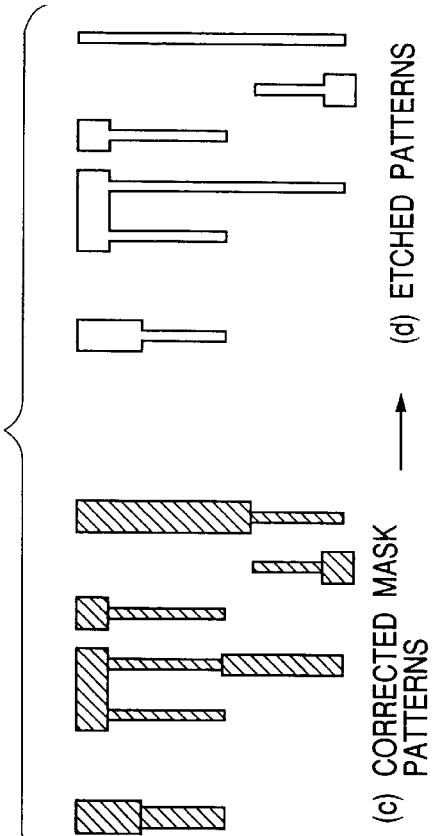

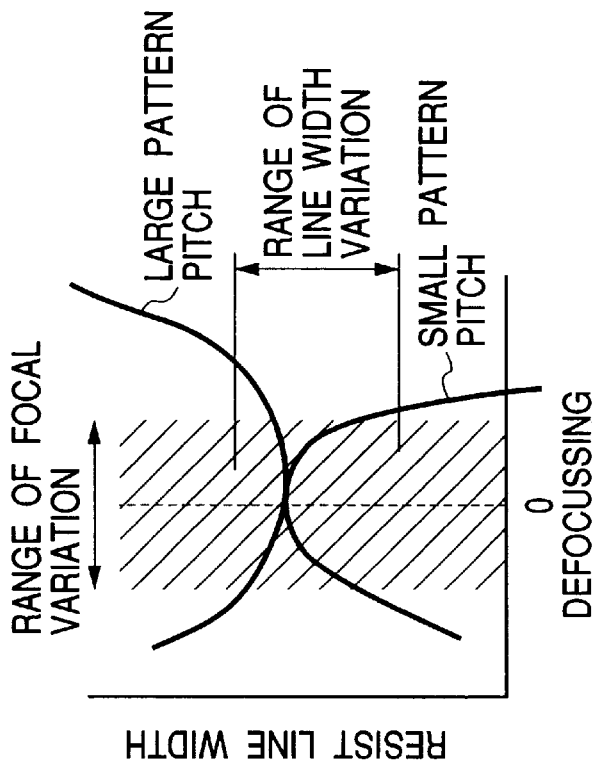
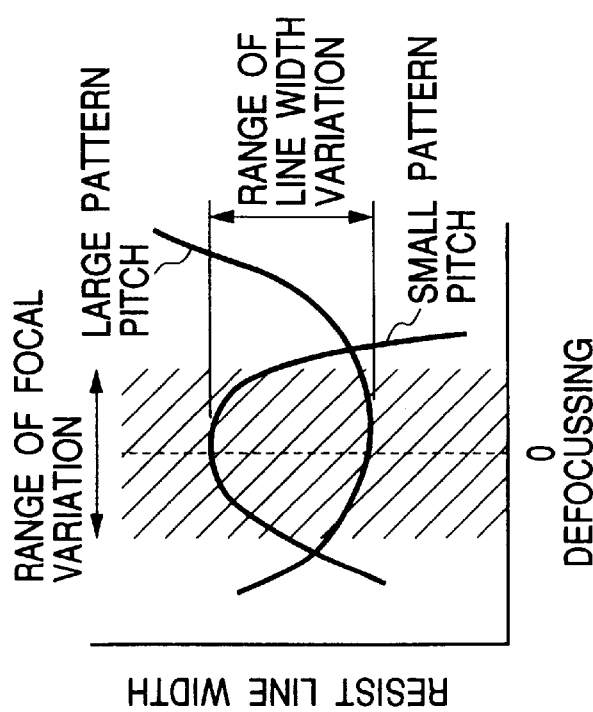

18 : DESIGNED TRANSISTOR GATE PATTERNS
19 : DUMMY GATE PATTERNS
2 : PHASE-SHIFTED REGION

COMPLETED PATTERNS

SEMICONDUCTOR DEVICE AND METHOD OF PRODUCING THE SAME

BACKGROUND OF THE INVENTION

1. Field of the Invention

The present invention relates to a semiconductor device and, more particularly, a semiconductor device including a logic semiconductor integrated circuit such as a CMOS logic LSI and a method of producing the semiconductor device.

Improvement in circuit performance and increase in integration density of a semiconductor integrated circuit (LSI) have been achieved by making a circuit pattern finer. In particular, in a logic LSI, its operating speed (operating frequency) has been improved by shortening a transistor gate length (Lg).

In formation of the circuits, photolithography (reduction projection exposure method) is used at present. The resolution has been improved by shortening the exposure wavelength and increasing numerical aperture of projection optics.

At present, the transistor gate length Lg has been shortened to 0.18 micron by using a KrF excimer laser exposure apparatus (wavelength of 248 nm). The intervals (pitches) of gates and wires have been being reduced to improve the integration density. It is presumed that 0.5 micron or less can be realized by using the KrF exposure apparatus.

It is expected that by using an ArF excimer laser exposure apparatus (wavelength of 193 nm), each of the transistor gate length Lg and the pitch can be reduced further by about 20 percent, but it is difficult to realize further reduction by a conventional reduction projection exposure method using deep ultra-violet radiation.

On the other hand, in photolithography, as a method of improving resolution without changing optics, a phase shifting mask is known. According to the method, by controlling (usually, inverting) the phase of light passing through a specific aperture in the mask, the resolution of the optics is improved much more than the case of using a conventional mask.

Among various kinds of phase shifting masks, an alternating phase shifting mask produces the highest effect on improvement in resolution.

The phase shifting method is described in, for example, "ULSI Lithography Technical Renovation", SCIENCE FORUM TOKYO, pp. 34–40, 1994.

Although the alternating phase shifting method is easily applied to alternating patterns as the name implies, generally, it cannot be always applied to a pattern of an arbitrary shape. For example, it is difficult to dispose a shifter in the case of a U-letter shaped pattern or three aperture patterns arranged at the shortest distance.

A method of performing multiple-exposure onto the same resist film by using a plurality of masks including the phase shifting mask to enable an arbitrary-shaped pattern to be transferred has been applied by the inventors of the present invention in Japanese Patent Nos. 2650962 (Publication of Japanese Unexamined Patent Application No. 1-283925) and 2638561 (Publication of Japanese Unexamined Patent Application No. 8-51068). The method is applied to, for example, a process of forming a gate of a logic LSI which has to be formed by controlling the line width of an extremely thin line pattern with high accuracy. Specifically, by disposing a phase shifter (region in which the phase of transmission light is inverted on a mask) so that the phases in the apertures on both sides of a gate are inverted, the resolution, line width accuracy, depth of focus, and the like of a transistor gate pattern can be largely improved.

Since an edge portion of the phase shifter is, however, generally transferred as an unnecessary pattern, in order to prevent it, it is necessary to divide an original design pattern into two mask patterns and perform multiple exposure.

For example, multiple exposure is performed on the same positive resist film by using two masks of a first mask 1A as shown in FIGS. 1A-1B and a second mask 1B as shown in FIG. 1C and developed. The first mask 1A has apertures 1a and 1b on both sides of a part (indicated as a region a) corresponding to a fine gate in an active region. A phase shifter 2 is provided for one of the apertures, for example 1a, so that the phases of light passing the apertures 1a and 1b neighboring the region (a) corresponding to the gate are opposite to each other. The second mask 1B includes a light shielding pattern 3 for covering the gate (region a) and a light shielding pattern 4 formed in the same layer as the light shielding pattern 3, for covering the region other than the fine gate.

Consequently, as shown in FIG. 1D, a desired resist pattern 5 is formed on a wafer. Narrow portions of the resist pattern 5 correspond to the gate mask formed by the light shielding pattern 3 of the second mask 1B. Similarly, thick portions correspond to the mask which is, for example, a wiring pattern formed by the light shielding pattern 4 of the second mask 1B.

The patterns on the two masks can be automatically generated from the original design pattern by a geometrical operation and a dedicated program for automatically generating patterns has been also developed.

It is considered that by using the method, the transistor gate length Lg can be reduced to about 0.12 micron by employing a KrF exposure apparatus. The combination of the masks to form the resist pattern of FIG. 1D is not limited to that of the masks 1A and 1B. For example, in place of the mask 1B, a mask 1D in which light shielding portions on fine gates are broadened as shown in FIG. 1E can be used.

The improvement in accuracy of the dimension is as important as the reduction in the transistor gate length Lg. The required dimensional accuracy of the a transistor gate length Lg is about 10% of normal design dimension. When the KrF exposure apparatus is used, it is therefore necessary to perform a dimension control at a 10 nm level. One of factors of deterioration in dimensional accuracy is a proximity effect such that the dimension and shape of a pattern fluctuate due to an influence of adjacent patterns.

Specifically, when transistor gate patterns (narrow portions) having uniform length Lg variously disposed as design mask patterns as shown in (a) of FIG. 2A are transferred onto a wafer, as shown in (b), the dimensions of actually etched gate patterns change according to the disposing state of the designed patterns. That is, as shown in the diagram, the designed gate pattern (narrow portion) becomes thick as a whole or partially.

It is known that the phenomenon is caused by complicatedly connected various effects such as a pure optical effect by diffraction of light, diffusion of reaction products in the resist, dependence on a developed area of a development rate, and a (micro)loading effect at the time of etching.

In order to solve the problem, therefore, an optical proximity effect correction technique for correcting the dimension of a mask pattern in consideration of the proximity effect has been being examined. To be specific, as schematically showing a correction mask in (c) of FIG. 2B, by correcting the design dimension of the transistor gate length Lg on the mask, the dimension of the gate pattern actually obtained on a wafer can be uniformized as shown by (d) in FIG. 2.

The correction of the light proximity effect is described in, for example, Proceedings of SPIE, Vol. 3334, pp. 921–931, 1998.

The proximity effect correction has, however, a problem such that very long time is required for a correction since a pattern is designed by estimating the degree of the proximity effect. Particularly, in the case of using a phase edge, a problem such that a correction rule is complicated. Further, exposure characteristics largely vary according to a distance to an adjacent gate. Especially, since the manner of a change in line width in association with deforcusing (hereinbelow, called defocus characteristics) largely varies, the following problem arises. Even if the proximity effect is corrected under certain optimum focusing conditions, when defocusing occurs on an actual wafer, the effect of the correction is lost.

Focus characteristics for the same design dimension patterns disposed at different pitches draw, for example, two curves shown in FIG. 3A (before the proximity effect correction). When a proximity effect is corrected so as to equalize the dimensions of the two patterns at the optimum focal point position (defocus=0), the focus characteristics of the patterns become as shown in FIG. 3B. It is understood that line width variations in a presumed range of focal variation are not improved.

The proximity effect becomes more conspicuous as the distance between the patterns is shortened. Particularly, the problem including the change in defocus characteristics becomes more conspicuous when the distance between the centers of the patterns equal to or is smaller than $2\lambda/NA$ ($\lambda$ denotes exposure wavelength and NA denotes numerical aperture of an exposure apparatus). When the phase shifting method is used, the pitch of gates can be reduced, so the problem becomes more serious.

Further, in the phase shifting method, the degree of spatial coherence of an exposure apparatus is often set to be high (the coherence factor $\sigma$ is set to be small). In this case, the proximity effect is more conspicuous. The proximity effect largely varies according to conditions of a process of forming a resist film and etching after exposure. On the other hand, once a mask is produced, it is difficult to correct or change it. Consequently, the proximity effect correction method also has a problem that it does not easily cope with a change or variation in process conditions.

SUMMARY OF THE INVENTION

It is therefore a first object of the invention to solve the problems of the conventional phase shifting method and to provide a high-performance semiconductor device in which variation in gate length caused by the proximity effect is suppressed. Further, it is a second object to provide a method of producing a semiconductor device capable of reducing the gate length and the pitch of gates while suppressing variation in gate length caused by the proximity effect when a semiconductor device in which the gate length is 0.2 micron or less is formed by photolithography.

The first object is achieved by a semiconductor device in which a dummy gate pattern which has the same device structure as that of a gate but is electrically inactive (that is, having no circuit function) is provided adjacent with a predetermined distance to a transistor gate pattern which is requested to be very accurate, formed in an active region, and is electrically active (that is, having a circuit function), wherein the minimum distance between the transistor gate pattern in the active region and another transistor gate pattern in the active region or the dummy gate pattern adjacent to the gate pattern in the active region is made substantially constant.

Preferably, when a distance P between the centers of the neighboring gate patterns or between the center of the transistor gate pattern and the center of the dummy gate pattern is $2\lambda/NA$ or shorter (where, $\lambda$ denotes an exposure wavelength and NA denotes a numerical aperture of an exposure apparatus), an amplitude of variation in the distance is suppressed within ±10%.

Further, the transistor gate pattern is achieved by being formed in a portion corresponding to an edge of a phase shifter in a phase shifting mask. The phase shifter has a constant line width within a range of the amplitude of variation when the width is converted to the distance on a wafer.

The transistor gate patterns may be also designed so as to be arranged on one-dimensional lattices arranged at predetermined intervals within a predetermined region. The dummy gate pattern may be removed after forming the transistor gate pattern (after etching) as necessary.

The second object is achieved by a method of producing a semiconductor device, comprising a step of performing exposure by using an alternating phase shifting mask in which a shifter line width L in the direction of transistor gate length is substantially constant, thereby forming a designed desired transistor gate pattern in a part of a shifter edge of the phase shifting mask and forming a dummy gate pattern having the same device structure as that of the gate but having no circuit function in the remaining portion of the shifter edge so as to be isolated from the transistor gate pattern, wherein each of a distance between the centers of the neighboring transistor gate patterns and a distance between the center of the transistor gate pattern and the center of the dummy gate pattern is $2\lambda/NA$ or smaller (where, $\lambda$ denotes an exposure wavelength and NA denotes a numerical aperture of an exposure apparatus) and its amplitude of variation is suppressed within ±10%, thereby making the minimum distance between each of all the transistor gate patterns and each of all the dummy gate patterns substantially constant.

When exposure is performed by using the phase shifting mask in practice, it is desirable to consider a reduction ratio of optics of a reduction projection exposure apparatus used. In this case, it is preferable to set the shifter line width L of the phase shifting mask to $2\lambda/(NA \times M)$ or smaller (where, M denotes a reduction ratio of optics used for exposure) and to set the amplitude of variation in shifter line width L within ±10%.

Further, the object is achieved by a method of producing a semiconductor device comprising: a step of designing a transistor gate pattern in a predetermined region where transistor gates exist in a semiconductor device so as to be disposed on a predetermined one-dimensional lattice, and performing multiple-exposure on the same resist formed on a semiconductor substrate by using: a first alternating phase shifting mask including a phase shifter which has a width substantially equal to a pitch of the lattice in the region within the amplitude of variation and is disposed so that an edge of the phase shifter substantially coincides with a center line of a desired transistor gate pattern; and a second mask in which a region including at least the transistor gate pattern is used as a light shielding region; a step of developing the resist film to thereby form resist patterns; and a step of etching a film to be processed on the semiconductor substrate by using the resist patterns as a mask. Preferably, at least portions on the lattice on both sides (in the direction of transistor gate length Lg) of the transistor gate pattern are included in the light shielding region of the second mask.

As shown in FIG. 1A which has been used to describe the principle of the conventional phase shifting method, in the first phase shifting mask 1A, two apertures 1a and 1b exist on both sides of the light shielding area (a) as a gate mask pattern. When the phase of light transmitting one of the apertures, for example 1a, is almost inverted by the phase shifter 2, as shown in partial magnification of FIG. 1B, a point which is in almost the center of the light shielding area (a) and is located equidistant from both edges of the two apertures 1a and 1b (that is, the position which is in the middle of the width of the light shielding area (a)) is defined as a phase edge 6 (shown by the broken line in the partial magnification).

Therefore, it does not always coincide with the edge of the outline of a phase shifter pattern on mask data for forming the phase shifting mask 1A or the edge of a mask substrate digging region for shifting a phase on an actual mask.

The distance from the phase edge defined as above and a neighboring phase edge over a region of a phase of 0 degree or a region of a phase of 180 degrees is defined as shifter line width L.

BRIEF DESCRIPTION OF THE DRAWINGS

FIG. 2A schematically shows the principle of a proximity effect according to a conventional phase shifting method, in which (a) is a plan view of designed mask patterns and (b) is a plan view of etched patterns obtained by exposing a resist film on a semiconductor substrate by using the designed mask patterns and etching a film to be processed on the semiconductor substrate by using resist patterns obtained by the exposure as a mask.

(c) in FIG. 2B is a plan view of designed mask patterns which are corrected to suppress the proximity effect of the designed mask patterns shown in (a) in FIG. 2A and (d) is a plan view of etched patterns obtained by exposing a resist film on a semiconductor substrate by using the designed mask patterns and etching a film to be processed on the semiconductor substrate by using resist patterns obtained by the exposure as a mask.

FIG. 3A schematically shows a problem of a conventional counter measure and focus characteristics of patterns of the same design dimension arranged at different pitches, which are before proximity effect correction.

FIG. 3B shows characteristics of a case of using patterns after the proximity effect correction for comparison with FIG. 3A.

Figure 4A:
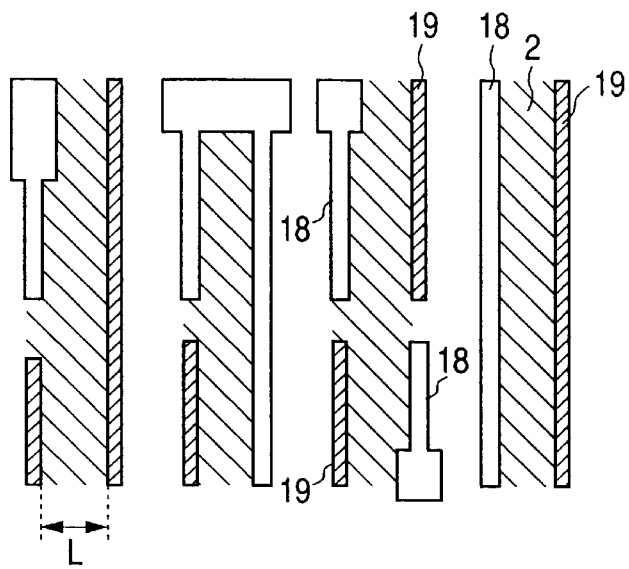

FIG. 4A is a plan view illustrating the disposing relationship of designed transistor gate patterns 18, dummy gate patterns 19 and phase-shifted regions 20, for schematically showing the principle of the invention.

Figure 4B:
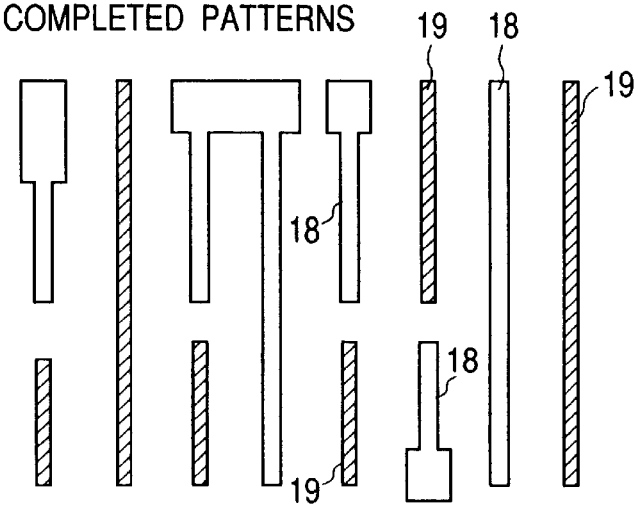

FIG. 4B is a plan view of completed patterns obtained by forming resist patterns on a semiconductor substrate by an exposing process and a developing process by using a mask pattern satisfying the relationship of FIG. 4A and etching a film to be processed on the semiconductor substrate by using the resist patterns as a mask.

Figure 5A:
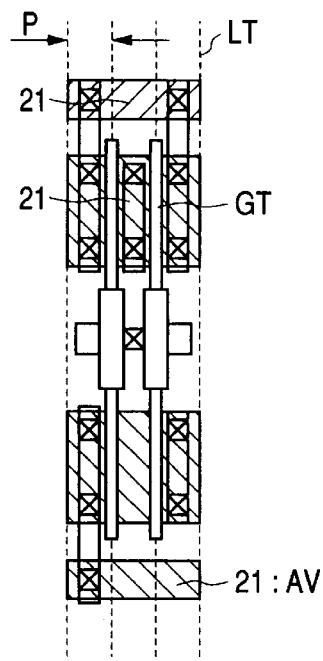

FIG. 5A is a plan view schematically showing an example of the layout of a basic logic cell as a first embodiment of the invention.

Figure 5B:
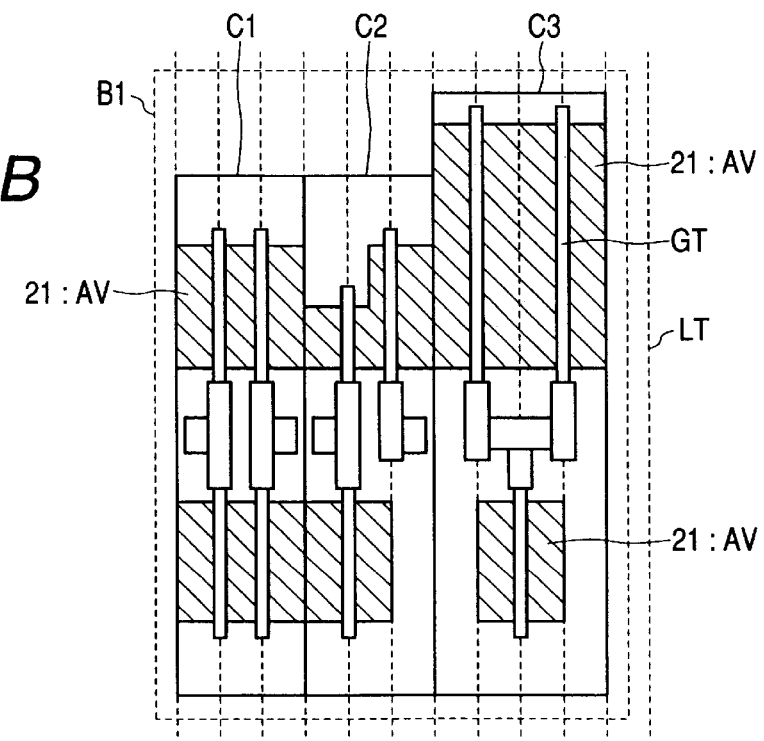

FIG. 5B is a plan view schematically showing a logic block B1 in which a plurality of basic logic cells are combined and arranged as the first embodiment of the invention.

Figure 6A:
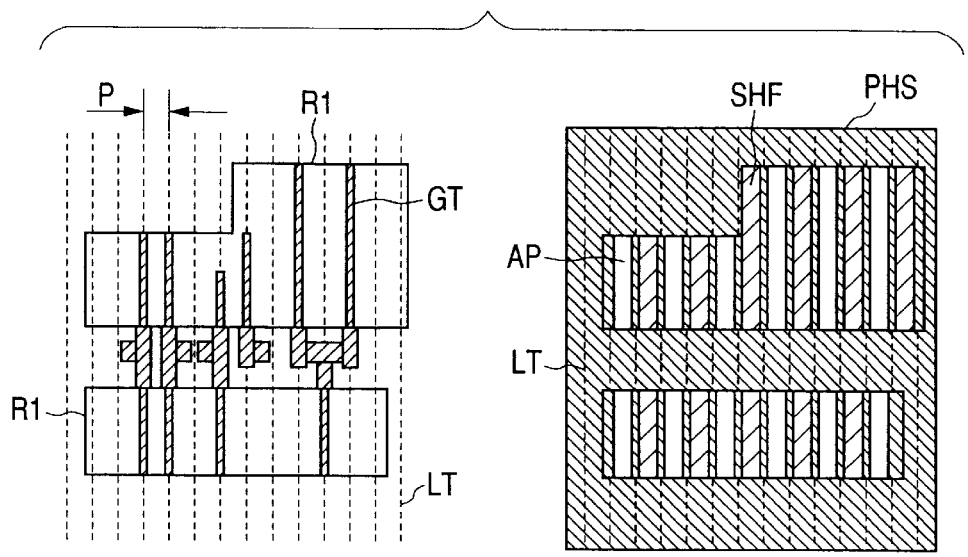

FIG. 6A is a schematic diagram showing an example of a mask generating method as the first embodiment of the invention, which is an alternating phase shifting mask PHS (first phase shifting mask).

Figure 6B:
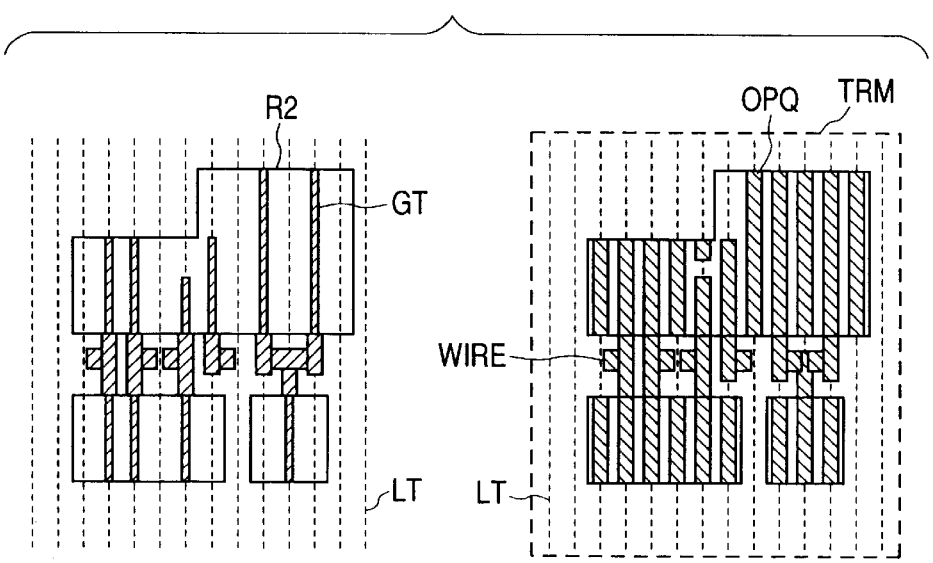

FIG. 6B is a schematic diagram showing an example of a mask generating method as the first embodiment of the invention, which is a trim mask TRM (second mask).

Figure 7:
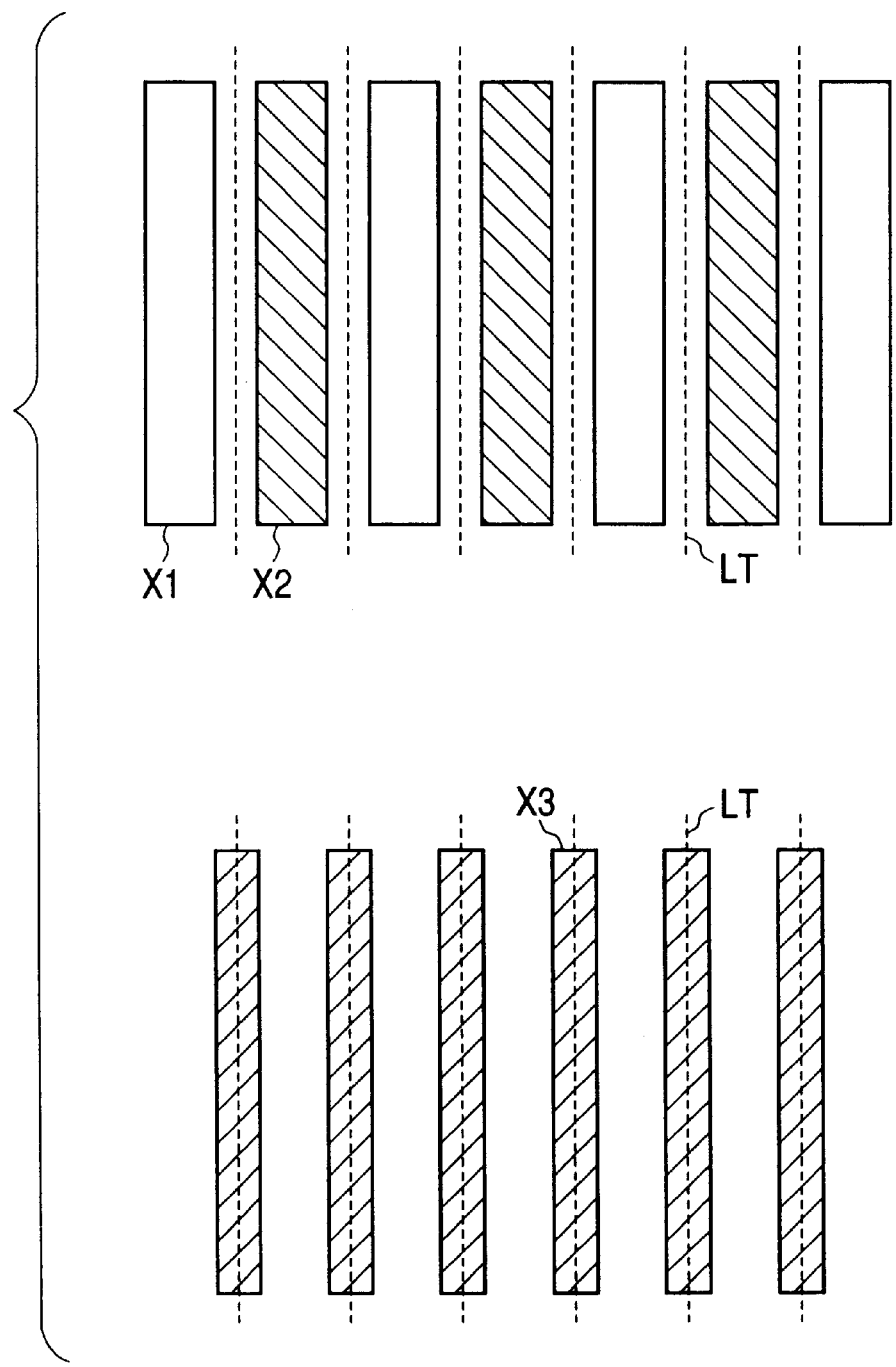

FIG. 7 is a schematic diagram showing an example of a method of generating a mask obtained by a geometrical operation as the first embodiment of the invention.

Figure 8:
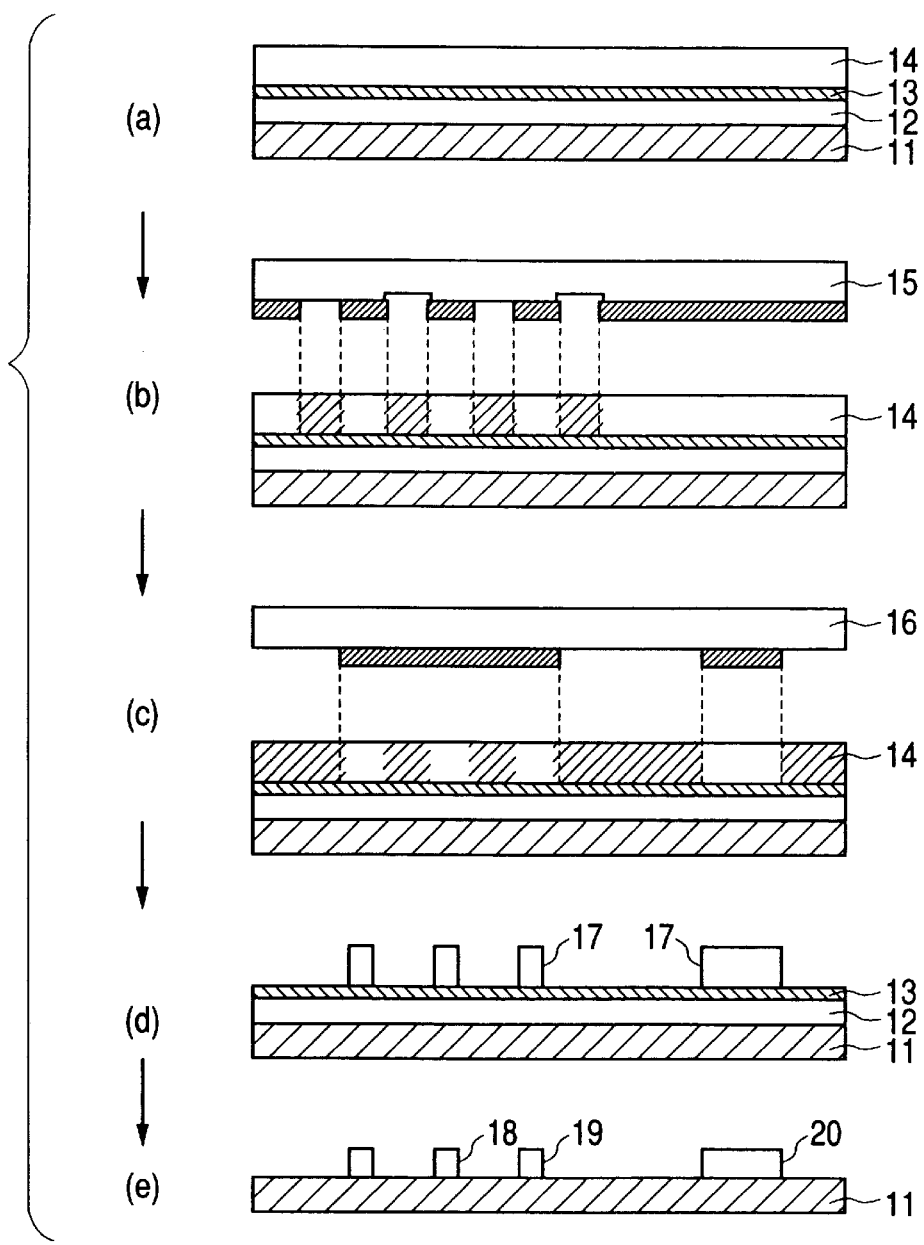

FIG. 8 is a process drawing of cross sections schematically showing processes of forming transistor gate patterns in a process of producing a semiconductor device as the first embodiment of the invention.

Figure 9:
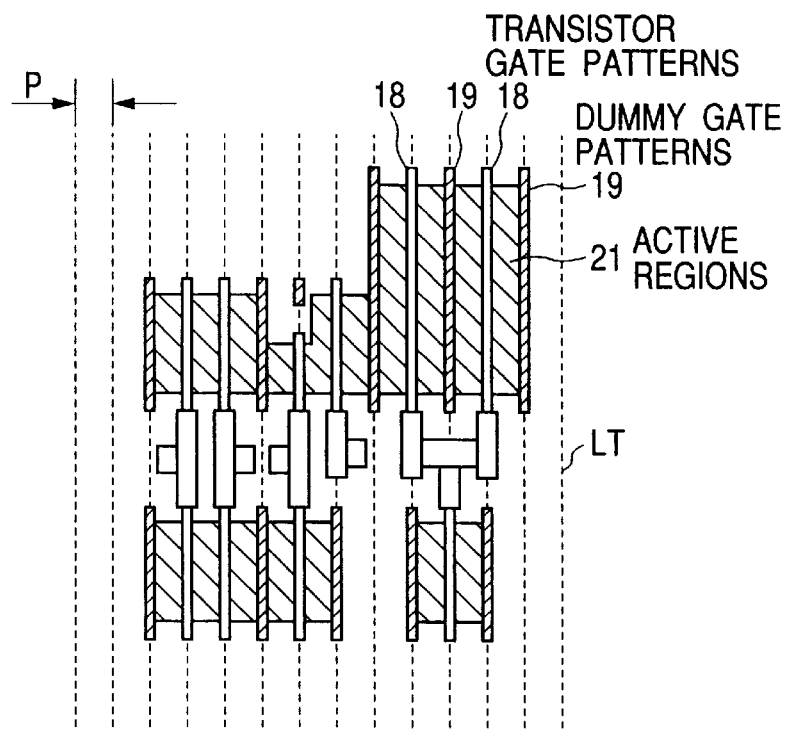

FIG. 9 is a plan view schematically showing transistor gate patterns 18 formed on the whole surface of a wafer in the process of producing the semiconductor device as the first embodiment of the invention.

Figure 10A:
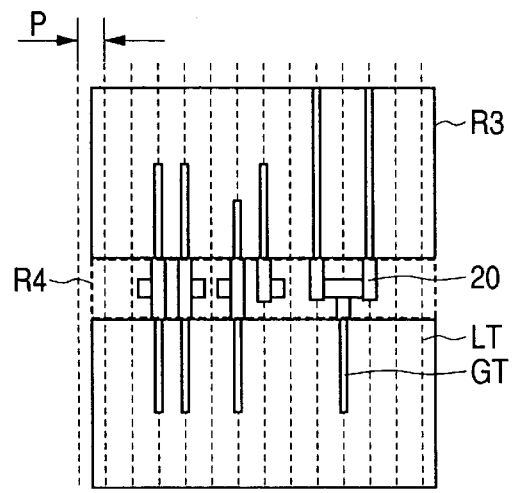

FIG. 10A is a schematic diagram of designed patterns, showing an example of a mask generating method according to a second embodiment of the invention.

Figure 10B:
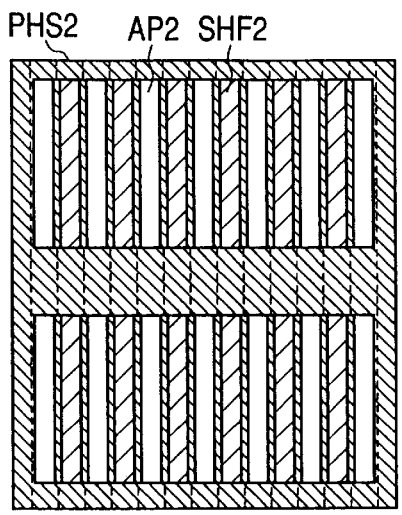

FIG. 10B shows alternating phase shifting patterns PHS2 (first phase shifting mask) as the second embodiment.

Figure 10C:
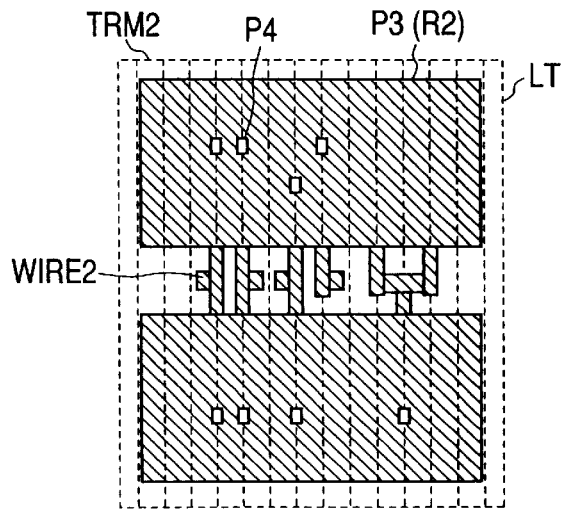

FIG. 10C shows a trim mask TRM2 (second mask) as the second embodiment.

Figure 11:
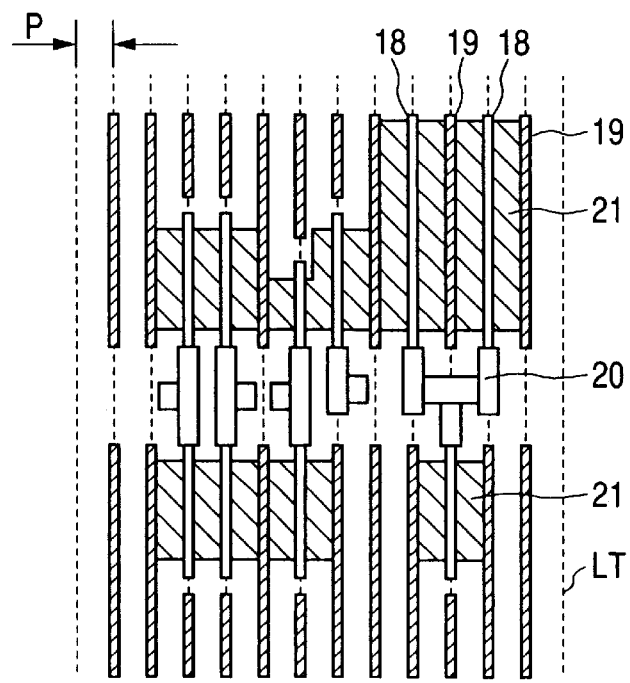

FIG. 11 is a plan view of transistor gate patterns produced by using the masks of FIGS. 10B and 10C as the second embodiment.

DETAILED DESCRIPTION OF THE PREFERRED EMBODIMENTS

An outline of the invention will be described by using FIGS. 4A and 4B. FIG. 4A is a plan view schematically showing the principle of the invention and the disposing relationship of designed transistor gate patterns 18, dummy gate patterns 19 and a phase-shifted region 2.

Figure 1A:
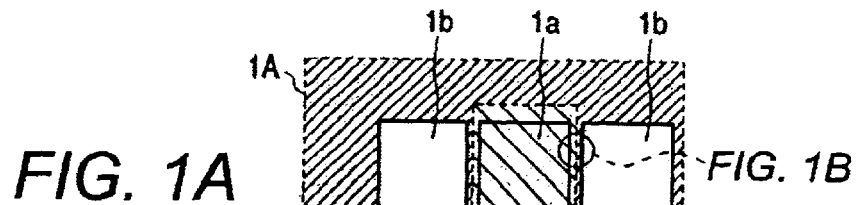
FIG. 1A is a plan view of a phase shifting mask 1A as a first mask, for schematically showing the principle of forming a gate pattern according to a conventional phase shifting method.
Figure 1B:
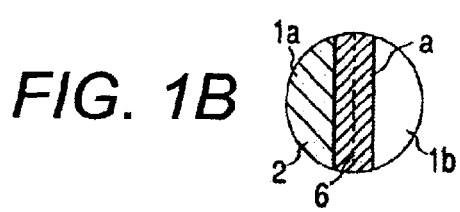
FIG. 1B is a partial magnification of FIG. 1A showing a light shielding region (a).
Figure 1C:
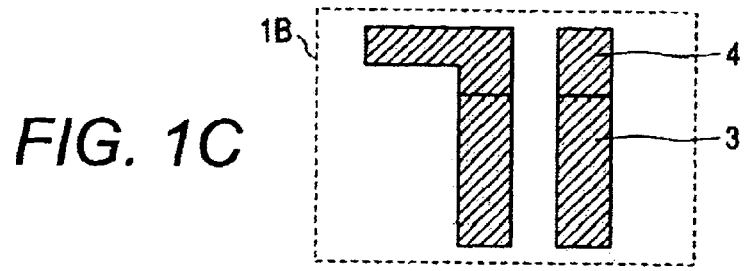
FIG. 1C is a plan view of a second mask 1B having light shielding portions 3 and 4, for schematically showing the principle of forming transistor gate patterns in accordance with the conventional phase shifting method.
Figure 1D:
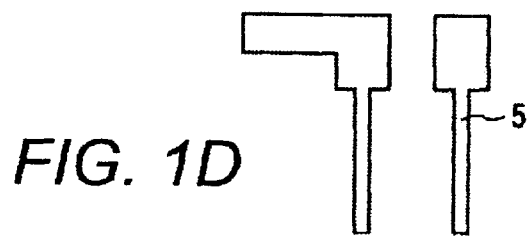
FIG. 1D is a plan view of a resist pattern obtained by performing exposure (multiple exposure) on a resist film on a semiconductor substrate by using the first phase shift mask 1A of FIG. 1A and the second mask 1B of FIG. 1C and carrying out development.
Figure 1E:
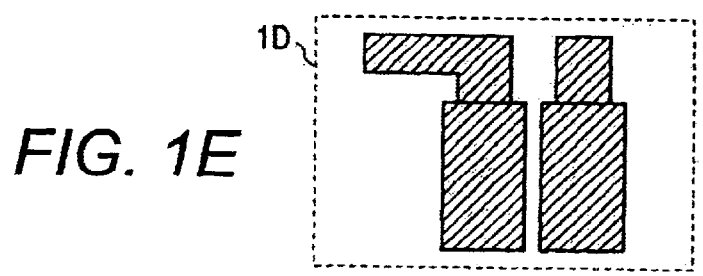
FIG. 1E is a plan view of a second mask 1D obtained by broadening the light shielding pattern 3 on a fine gate of the second mask 1B shown in FIG. 1C, for schematically showing the principle of forming a transistor gate pattern according to the conventional phase shifting method.

FIG. 4B is a plan view of completed patterns obtained by: forming resist patterns on a semiconductor substrate by a multiple exposure process and a developing process by using the first phase shifting mask 1A and the second mask 1B formed as shown in FIGS. 1A and 1C, respectively, to form the designed gate patterns 18 and the dummy gate patterns 19 in FIG. 4A; and etching a film to be processed on the semiconductor substrate by using the resist patterns as a mask.

The basic idea of the invention is not a correction of the proximity effect on given designed patterns but to generate patterns so as not to cause variations in line width by the proximity effect. Consequently, first, when an alternating phase shifting mask is used to form a transistor gate pattern, the amplitude of variation in shifter width in the direction of transistor gate length is suppressed within ±10%.

It makes the optical diffraction effect almost the same on all of patterns. Dimensional variation due to variation in the proximity effect caused by different pattern disposing conditions is suppressed. Since defocus characteristics of transistor gate patterns also become equivalent to each other, variation in dimension at the time of defocusing is also minimized.

Second, when other transistor gate patterns 18 do not exist on a line apart from the center of each of the transistor gate patterns by a predetermined distance (the above-described shifter width), the dummy gate pattern 19 having the same structure as that of the gate is provided so that the center of dummy gate is on the line. The dummy gate pattern 19 can be formed by using a dark line which is automatically generated in correspondence with the phase edge. It is preferable to isolate the dummy gate having no circuit function from an inherent gate pattern by a proper method.

By the arrangement, the minimum distance from an arbitrary point on the gate to an adjacent gate or an adjacent dummy gate becomes almost constant. Consequently, the peripheral circumstances of all of the transistor gate patterns become equivalent at the time of development and etching. The dimensional variation due to the microloading effect and the like is therefore suppressed.

The dummy patterns 19 are provided on both sides of each of all of the gate patterns 18 in FIGS. 4A and 4B. Even when the dummy pattern 19 is provided only on one side of the gate pattern 18, however, effects to a certain degree can be expected. Especially, it can be expected that the dimensional variation due to the proximity effect caused by light diffraction is reduced. In this case, it is unnecessary that all of the transistor gate patterns are arranged on a lattice at a predetermined pitch P as shown in FIGS. 4A and 4B. It is, however, preferable to make at least the line width L of at the phase shifter constant.

Specific embodiments of the invention will be described hereinbelow. In the following description, for convenience, it is assumed that all transistor gate patterns extend in the longitudinal direction of the drawing sheet. Therefore, the lateral direction denotes the direction of transistor gate length and the vertical direction indicates the direction of transistor gate width.

A preferred embodiment of the invention of forming transistor gate patterns on a semiconductor substrate by using the first phase shifting mask and the second mask will be schematically explained.

First, resist patterns are formed according to a known lithography technique. Specifically, a resist film formed on a semiconductor substrate is exposed by using the masks and developed, thereby forming desired resist patterns.

As a resist film, a positive resist film is preferred. A preferred light source of an exposure apparatus for performing multiple exposure on the resist film is, for example, a KrF excimer laser or ArF excimer laser of a wavelength λ of 249 nm or shorter.

By using the resist patterns as a mask, a film to be processed on the semiconductor is selectively etched by a known etching technique, thereby forming desired transistor gate patterns.

The film to be processed on the semiconductor substrate is a multilayered stack film including a known conductive film for forming a transistor gate. It is desirable that an anti-reflective film is formed as the uppermost layer of the multilayered stack film in order to prevent reflection at the time of exposure.

The known conductive film for forming a transistor gate as the film to be processed is generally a stack film including at least one of a polysilicon film; a polysilicon film/a silicide film; a polymetal film; and a refractory metal film such as tungsten, molybdenum, tantalum, or the like.

FIRST EMBODIMENT

Logic circuit patterns for a cell-based CMOS logic integrated circuit are designed as follows. First, in the designing of all of target basic cells, as schematically shown by a plan view of cells in FIG. 5A, fine gate patterns GT are arranged so that the center of each of the gate patterns is on a one-dimensional lattice LT which extends in the vertical direction having a predetermined pitch P.

As schematically shown in FIG. 5B, a plurality of basic cells (C1, C2, and C3 in the diagram) are combined and arranged, thereby generating a logic block B1. By arranging the basic cells so that the lattices of the neighboring cells are aligned, the whole logic block is covered with the one-dimensional lattice and all of the fine gate patterns GT exist on the lattice LT.

As shown in (a) in FIG. 6A, each of all of gate pattern GT figures in the active region AV is broadened on both sides in the lateral direction each side by 2P (or more). The region is also broadened vertically only by a proper distance. The resultant region is defined as a region R1 where transistor gates exist. In the region R1, the alternating phase shifting mask PHS (first alternating phase shifting mask) adjusted at the lattice pitch is generated. In the PHS, an aperture AP is formed between neighboring lattices included in the region R1 and, further, a phase shifter SHF is provided in every other aperture so that the phases of light transmitting the neighboring apertures are opposite to each other. Almost the whole region R1 is covered with the apertures AP and the phase shifters SHF.

As shown in (b) of FIG. 6B, in a manner similar to R1 shown in [(a) of] FIG. 6A, all of the gate pattern GT figures in the active region are broadened in the lateral direction by 1.5P (arbitrary value equal to or larger than P and smaller than 2P). The region is also broadened in the vertical direction only by a proper distance. The resultant region is defined as a region R2.

Further, a mask pattern P1 (not shown) is formed in which a lattice included in R2 is defined as a light shielding region. The width of p1 is set to the same as that of the gate pattern GT. A dummy gate pattern DM is obtained by subtracting the pattern P2 (not shown) derived by broadening the gate pattern GT by a proper amount from P1. A pattern feature OPQ is obtained by adding GT and DM and further broadening its edge toward outer region. Designed patterns WIRE in the region other than the region R2 are combined with OPQ to thereby obtain a trim mask TRM (second mask).

The mask patterns AP, SHF, and P1 can be easily formed as follows.

Patterns X1, X2 and X3 adjusted to the lattice LT as shown in FIG. 7 are prepared. AP denotes an overlapped region of R1 and X1+X2 and SHF denotes an overlapped region of R1 and X1. The overlapped regions are obtained by a geometrical operation. P1 is obtained by an overlapped region of R2 and X3.

The first alternating phase shifting mask including the phase shifting patterns PHS and the second mask including the trim mask pattern feature TRM which are formed as mentioned above are prepared. By using the masks, multiple exposure is performed on the same resist film. Consequently, while applying the phase shifters 20 to the fine gates 18, the dummy gate patterns 19 which are electrically inactive are generated around the isolated fine gates 18 and, further, various patterns WIRE (wiring patterns for gate) other than the fine gates existing in the same mask layer can be formed.

The invention is not limited to the above-described pattern forming method as long as similar effects can be obtained.

Since the gates are disposed on the fixed predetermined lattice LT, the phase shifters SHF can be uniformly formed on the whole logic block without depending on the patterns in the cell. At the stages of designing and placing the cells, it is therefore unnecessary to consider the phase shifting at all.

The trim mask as a second mask is formed by the geometrical operation in accordance with a predetermined rule. It is also possible to form the trim mask patterns TRM at the stage of the basic cells and, after combining the basic cells as blocks, perform a geometrical operation again near a cell boundary and the like. By using a known geometrical operation tool which can use hierarchical structure of design, a high speed process can be realized.

The method of forming the two masks (first alternating phase shifting mask and second mask) used in the process of producing the semiconductor device of the invention has been described.

An example of a method of producing a semiconductor device, in which a mask is produced on the basis of the mask pattern data and a gate pattern of an LSI is processed by using the mask will now be described.

A process of producing gate patterns will be specifically described hereinbelow according to a process drawing of cross sections schematically shown in FIG. 8.

First, as shown in a process (a), a gate film 12 as a stack film in which a polysilicon film, a barrier metal, a tungsten film, and an Si oxide film are sequentially stacked is deposited on a predetermined LSI substrate 11. A predetermined anti-reflective film 13 is applied on the gate film 12. Further, a commercial positive resist 14 for KrF excimer laser is applied on the anti-reflection film 13. On the substrate, predetermined alignment marks (not shown) are preliminarily formed.

As shown in a process (b), after aligning a mask 15 (first mask) having mask patterns PHS which have been described with reference to FIG. 6A with the alignment marks, first exposure is performed by using a reduction projection exposure apparatus (not shown) employing a known KrF excimer laser as a light source.

As shown in a process (c), a mask 16 (second mask) having the mask patterns TRM which have been described with reference to FIG. 6B is aligned with the alignment marks and exposure is performed. In such a manner, multiple exposure by using two masks is performed on the resist film 14.

After that, by performing a predetermined heat treatment, a photochemical reaction occurs according to a light irradiation amount in the resist, thereby changing the solubility of the resist. In the example, the heat treatment is carried out at 110C degrees for 90 seconds. It increases the development rate of the exposed resist film into a developer.

As shown in the following process (d), the exposed resist film is developed by using a commercially available developer under known developing process conditions, thereby forming resist patterns 17 in areas where desired gates, dummy gates, and wiring patterns made by gate layer are to be formed.

As shown in a process (e), as a final process, the anti-reflection film 13 and the oxide film as the uppermost layer of the gate film 12 are etched by using the resist patterns 17 as a mask. Further, the rest of the gate stack film 12 is etched by using the oxide film as a mask. After that, the resist 17 and the anti-reflection film 13 are removed and the desired transistor gate patterns 18, dummy gate patterns 19 and wiring patterns 20 constructed by gate layer are formed.

According to the embodiment, the transistor gate patterns 18 having the uniform transistor gate length Lg as shown in FIG. 9 can be formed on the whole surface of the wafer together with the dummy gate patterns 19 and the wiring patterns 20 without performing the proximity effect correction as carried out in the conventional phase shifting method. P in FIG. 9 indicates the pitch of the one-dimensional lattice LT and reference numeral 21 denotes active regions.

The invention is not limited to those described in the embodiments, such as the materials of the gate stack film, kinds of the exposure apparatus, process of forming the resist film, and process of forming the transistor gate. Also, the order of exposure of the two masks can be changed.

SECOND EMBODIMENT

Another embodiment of producing a logic LSI by forming transistor gate patterns on a semiconductor substrate by using the method of generating mask patterns and using masks obtained by the method will be described with reference to FIGS. 10A, 10B, and 10C and FIG. 11. The method of generating mask patterns are used for the semiconductor device of the invention and the method of producing the semiconductor device.

FIGS. 10A, 10B, and 10C are explanatory diagrams related to the production of the masks. FIG. 11 is a plan view of transistor gate patterns formed by the masks.

First, the production of masks will be described. FIG. 10A shows designed pattern features of the gate patterns GT and the wiring patterns 20. FIG. 10B shows the alternating phase shifting mask PHS2. FIG. 10C shows the trim mask TRM2.

In the embodiment, as shown in FIG. 10A, a region R3 where transistor gates exist and a gate layer wiring region R4 are predefined upon designing the mask.

As shown in FIG. 10B, a dark-field mask PHS2 in which aperture patterns AP2 and shifter patterns SHF2 are disposed so as to be spread in the region R3 is generated (which will become a first alternating phase shifting mask).

As shown in FIG. 10C, a region R2 obtained by lessening the region R3 by a geometrical operation is used as a pattern P3, ends of the gates are extracted in the region R2 and patterns P4 are formed at the ends. A clear-field mask TRM2 (as a second mask) in which a pattern (P3−P4+WIRE2) obtained by subtracting P4 from P3 and adding a pattern WIRE2 such as wires formed by the same layer (gate layer) in the region R4 is used as a light shielding pattern is generated.

In a manner similar to the first embodiment, by using the mask PHS2 (first alternating phase shifting mask) and the mask TRM2 (second mask), multiple exposure is performed on a known positive resist film preliminarily formed on a semiconductor substrate for forming a logic LSI.

After that, predetermined developing process and gate etching process are performed by known methods. As a result, an LSI having the gate patterns 18 including the dummy patterns 19 and the wiring patterns 20 shown in FIG. 11 is obtained. Reference character P in FIG. 11 denotes the pitch of the one dimensional lattice LT and reference number 21 denotes an active region.

Although all of patterns are generated on the lattice LT in R2 shown in FIG. 10C, patterns having no circuit function (dummy patterns 19) are isolated by parts corresponding to the apertures P4 in the exposure with the mask TRM2. Consequently, they do not exert any influence from the view point of electric characteristics.

THIRD EMBODIMENT

A mask TRM3 (third mask) having patterns obtained by broadening only the dummy gate patterns 19 in the second embodiment is generated. By using the mask TRM3, resist patterns for protecting the parts (the gate patterns 18 and the wiring patterns 20) other than the dummy gates 19 of the LSI obtained in the second embodiment are formed. Only the exposed dummy gates 19 are selectively etched by using the resist patterns as a mask.

Although the etching process is performed under the same conditions as the etching of the gate patterns 18 in the second embodiment, for example, known wet etching or the like may be performed. Consequently, for example, a capacitance between neighboring gates can be reduced.

As described specifically above, according to the invention, exposure is performed by using the phase shifting mask having the constant shifter line width L in the direction of transistor gate length Lg. The designed gate pattern is formed in a part of the shifter edge of the phase shifting mask. The dummy gate pattern which has the same device structure as that of the gate but does not have a circuit function is provided so as to be isolated from the gate pattern, thereby making the minimum distance between each of all of the gate patterns and each of the dummy gate patterns almost constant except for the gate end portions and corners.

Thus, optical diffraction effects are almost equalized with respect to all of the patterns. The variation in the optical proximity effect is suppressed and the peripheral circumstances of all of the transistor gate patterns become equivalent at the time of development and etching, so that dimensional variation caused by the microloading effect or the like can be also suppressed. A high-performance semiconductor device with suppressed variations in transistor gate length can be realized.

What is claimed is:

1. A method of producing a semiconductor device comprising:
   (1) a step of designing a transistor gate pattern in a predetermined region where transistor gates exist in a semiconductor device so as to be centered on predetermined lines of a lattice, and performing multiple-exposure on a resist film formed on a semiconductor substrate by using: a first alternating phase shifting mask including phase shifters between successive lines of the lattice, the phase shifters having a width substantially equal to a pitch of the lattice in the region and disposed so that an edge of the phase shifters substantially coincide with a line of a desired transistor gate pattern; and a second mask in which a region including the transistor gate pattern and a dummy gate pattern isolated from the transistor gate pattern on the lattice in the region is used as a light shielding region;
   (2) a step of developing the resist film to thereby form resist patterns; and
   (3) a step of etching a film to be processed on the semiconductor substrate by using the resist patterns as a mask;
      wherein the shifter line width L of the phase shifting mask is $2\lambda/(NA \times M)$ or smaller, where M is a reduction ratio of optics used for exposure, and wherein an amplitude of variation in the shifter line width L lies within $\pm 10\%$.

2. A method of producing a semiconductor device according to claim 1, wherein at least portions on the lattice on both sides of the transistor gate pattern are included in the light shielding region of the second mask.

3. A method of producing a semiconductor device according to claim 1, wherein the resist film is a positive resist film, the multiple exposure is performed with exposure light having a wavelength of 249 nm or shorter by using a KrF excimer laser or an ArF excimer laser as a light source and, after the multiple exposure is performed, a predetermined heat treatment is carried out to increase solubility of an exposed region of the resist film into a developer.

4. A method of producing a semiconductor device according to claim 1, wherein a film to be processed on the semiconductor substrate is a multilayered stack film including at least a conductive film for forming a transistor gate.

5. A method of producing a semiconductor device comprising,
   a step of forming a circuit pattern block having fine line patterns by multiply exposing a phase-shifting mask including phase-shifting light transmitting apertures in an opaque region, and a binary mask including a light transmitting region and an opaque region onto a resist film formed on the semiconductor device substrate,
   wherein said fine line patterns have different respective distances to adjacent ones of said fine line patterns,
   wherein said fine line patterns are formed in regions of the resist film corresponding to areas between pairs of light transmitting apertures with reversed phase transmission on the phase-shifting mask, and
   wherein a variation in width of said light transmitting apertures in a direction normal to the fine line patterns formed between each adjacent pair of apertures being within $\pm 10\%$ in the circuit pattern block.

6. A method of producing a semiconductor device according to claim 5, wherein a distance between centers of the two adjacent fine line patterns is equal to a minimum value of said distance within the pattern block, or is not shorter than twice the minimum value of said distance within the pattern block, so that the light transmitting apertures in the block have substantially equal widths in a direction normal to the center of the fine line patterns formed between each adjacent pair of apertures.

7. A method of producing a semiconductor device according to claim 5, wherein said fine line pattern is a transistor gate in the semiconductor device.

8. A method of producing a semiconductor device comprising,
   a step of forming a circuit pattern block having fine line patterns by multiply exposing a phase-shifting mask including phase-shifting light transmitting apertures in an opaque region, and a binary mask including a light transmitting region and an opaque region onto a resist film formed on the semiconductor device substrate, wherein said fine line patterns have different respective distances to adjacent ones of said fine line patterns, wherein said fine line patterns are formed in regions of the resist film corresponding to areas between pairs of light transmitting apertures with reversed phase transmission on the phase-shifting mask, wherein at least one additional light transmitting aperture is placed next to at least one of two apertures in the aperture pairs for forming the fine line patterns, so as to achieve alternating change in phase transmission for the additional aperture and the pairs of apertures, so that optical image characteristics are substantially the same for the fine line patterns with different distances to adjacent patterns, and wherein a shifter line width L of the phase shifting mask is $2\lambda/(NA \times M)$ or smaller, where M is a reduction ratio of optics used for exposure, and wherein an amplitude of variation in the shifter line width L lies within ±10%.

9. A method of producing a semiconductor device according to claim 8, wherein said fine line pattern is a transistor gate in the semiconductor device.

* * * * *